(12) United States Patent
Weidner

(10) Patent No.: US 7,910,470 B2
(45) Date of Patent: Mar. 22, 2011

(54) METALLISED FILM FOR SHEET CONTACTING

(75) Inventor: Karl Weidner, München (DE)

(73) Assignee: Siemens Aktiengesellschaft, Munich (DE)

( * ) Notice: Subject to any disclaimer, the term of this patent is extended or adjusted under 35 U.S.C. 154(b) by 623 days.

(21) Appl. No.: 11/791,608

(22) PCT Filed: Nov. 21, 2005

(86) PCT No.: PCT/EP2005/056094
§ 371 (c)(1),
(2), (4) Date: May 25, 2007

(87) PCT Pub. No.: WO2006/058850
PCT Pub. Date: Jun. 8, 2006

(65) Prior Publication Data
US 2008/0093727 A1   Apr. 24, 2008

(30) Foreign Application Priority Data
Nov. 29, 2004   (DE) .................. 10 2004 057 494

(51) Int. Cl.
*H01L 21/4763* (2006.01)
(52) U.S. Cl. ...................... 438/597; 361/795
(58) Field of Classification Search .......... 257/E23.06
See application file for complete search history.

(56) References Cited

U.S. PATENT DOCUMENTS

| | | | | |
|---|---|---|---|---|
| 3,825,803 A | * | 7/1974 | Budde | 257/712 |
| 4,918,811 A | * | 4/1990 | Eichelberger et al. | 438/107 |
| 5,336,928 A | * | 8/1994 | Neugebauer et al. | 257/758 |
| 5,359,496 A | * | 10/1994 | Kornrumpf et al. | 361/795 |
| 5,478,616 A | * | 12/1995 | Kochem et al. | 428/35.2 |
| 5,856,913 A | | 1/1999 | Heilbronner | |
| 6,239,980 B1 | | 5/2001 | Fillion et al. | |
| 6,294,741 B1 | | 9/2001 | Cole, Jr. et al. | |
| 6,788,724 B2 | * | 9/2004 | Sell et al. | 372/92 |
| 6,881,071 B2 | | 4/2005 | Heilbronner | |
| 7,208,347 B2 | * | 4/2007 | Seliger et al. | 438/124 |
| 7,368,324 B2 | * | 5/2008 | Weidner et al. | 438/121 |
| 7,402,457 B2 | * | 7/2008 | Hase et al. | 438/106 |
| 7,427,532 B2 | * | 9/2008 | Seliger et al. | 438/106 |
| 7,439,614 B2 | * | 10/2008 | Inoue et al. | 257/700 |
| 2002/0155632 A1 | * | 10/2002 | Yamazaki et al. | 438/29 |
| 2003/0164556 A1 | * | 9/2003 | Jiang et al. | 257/787 |
| 2005/0121785 A1 | * | 6/2005 | Stelzl et al. | 257/738 |
| 2006/0248716 A1 | * | 11/2006 | Weidner et al. | 29/843 |

(Continued)

FOREIGN PATENT DOCUMENTS

DE    23 14 247 A1   10/1973

(Continued)

*Primary Examiner* — Thanh V Pham
*Assistant Examiner* — Mohammad Choudhry
(74) *Attorney, Agent, or Firm* — Harness, Dickey & Pierce, P.L.C.

(57) ABSTRACT

An embodiment of the present invention discloses a method for contacting at least one electrical contact surface on a surface of a substrate and/or at least one component arranged on the substrate, especially a semiconductor chip. The method includes the following steps: at least one insulating film consisting of an electrically insulating plastic material is laminated, under a vacuum, onto the surfaces of the substrate and the component including the contact surface; and the contact surface to be contacted on the surfaces is bared by opening a window in the insulating film. An embodiment of the present invention further comprises sheet contacting the bared contact surface with at least one metallisation on an insulating film.

19 Claims, 2 Drawing Sheets

U.S. PATENT DOCUMENTS

| | | | |
|---|---|---|---|
| 2007/0216025 A1* | 9/2007 | Seliger et al. | 257/734 |
| 2009/0026602 A1* | 1/2009 | Schimetta et al. | 257/690 |

FOREIGN PATENT DOCUMENTS

| | | |
|---|---|---|
| DE | 196 17 055 C1 | 6/1997 |
| DE | 101 21 970 A1 | 11/2002 |
| EP | 0 588 603 A2 | 3/1994 |
| EP | 0 987 760 A2 | 3/2000 |
| WO | WO 03/012856 A2 | 2/2003 |
| WO | WO 03/030247 A2 | 10/2003 |
| WO | WO 2004/086502 A1 | 10/2004 |

* cited by examiner

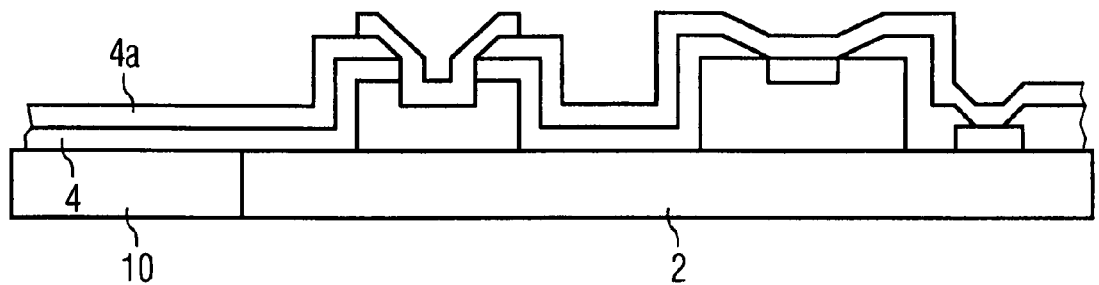
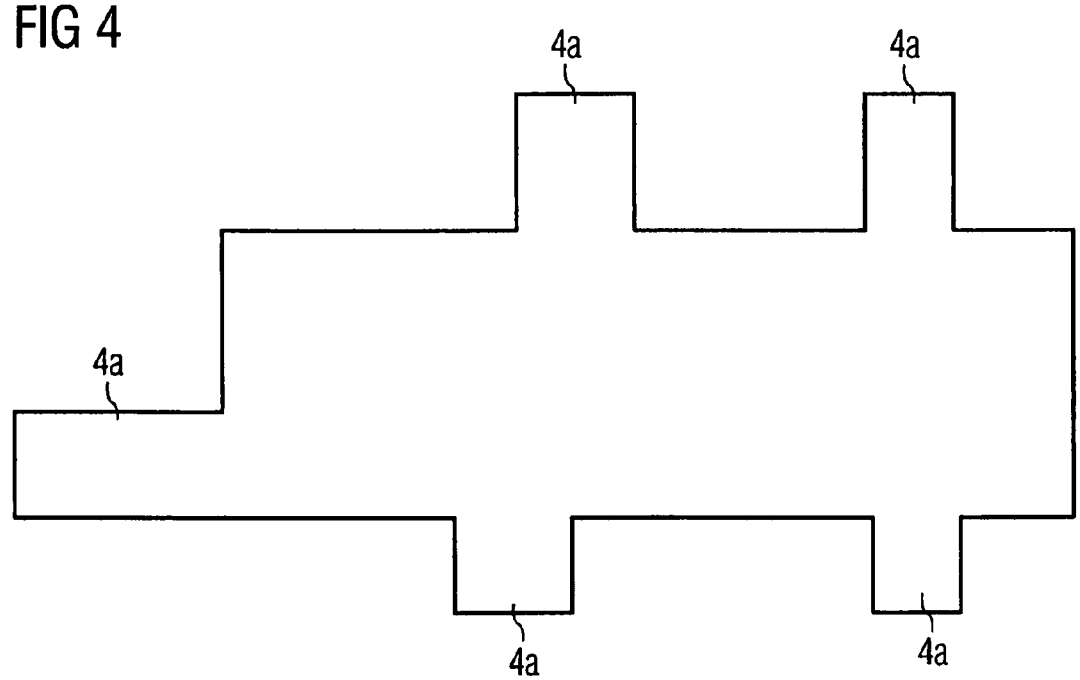

METALLISED FILM FOR SHEET CONTACTING

PRIORITY STATEMENT

This application is the national phase under 35 U.S.C. §371 of PCT International Application No. PCT/EP2005/056094 which has an International filing date of Nov. 21, 2005, which designated the United States of America and which claims priority on German Patent Application number 10 2004 057 494.4 filed Nov. 29, 2004, the entire contents of which are hereby incorporated herein by reference.

FIELD

At least one embodiment of the present invention generally relates to a method for contacting one or more electrical contact areas on a surface of a substrate and/or at least one component. For example, the method may include the step of laminating at least one insulating film of electrically insulating plastic material onto the surfaces of the substrate and of the component under a vacuum, so that the insulating film closely covers the surface that has the contact area or areas and adheres to this surface.

BACKGROUND

WO 03/030247 discloses a method for contacting, including the further steps of: baring each contact area to be contacted on the surface by opening respective windows in the film, and sheet contacting each bared contact area with a layer of electrically conducting material. According to this method, after the sheet contacting, at least one conductor track is created in and/or on the layer of electrically conducting material. To produce a multilayered device, the steps of laminating, baring, contacting and creating the conductor track are carried out repeatedly.

A disadvantage of the conventional contacting method is the effort that is necessary for the contacting, in particular of components on a surface of a substrate. A large number of process steps are required.

SUMMARY

At least one embodiment of the present invention overcomes at least one of the disadvantages of conventional methods and makes it possible to simplify the contacting of contact areas on a substrate surface, in particular of contact areas on components on a substrate surface.

At least one embodiment of the present method serves for contacting merely a substrate structure or at least one component on a substrate or at least one component together with a substrate. In this case, the laminating of at least one insulating film of electrically insulating plastic material onto the surface of the substrate or component, in particular under a vacuum, may be performed in such a way that the insulating film closely covers the surface respectively lying under it and adheres to it.

Before or after lamination, provision of at least one metallization, formed on at least one surface side of the insulating film, is performed. This serves for providing conductor tracks or conductor-track or contacting structures. These connecting structures may be formed by conventional methods already before the lamination. In this case, the films with one-sided metallization or with two-sided metallization may be created on an insulating film. Suitable in particular as a metallized insulating film is a copper coating of a plastic film over its full surface area or part of its surface area or prestructured with the conductor tracks. Other metals that are comparable in terms of resistivity or processibility may similarly be used.

Windows may be created in a simple way before or after the respective laminating step—mechanically, for example by punching, chemically, for example by etching, or physically, by lasering or plasma opening. The contacting may be carried out by leading the metallization in to the electrical contact area or by leading the electrical contact area out to the metallization. The contacting is performed under an advantageous pressure and under an advantageous temperature. Sheet contacting is preferred. Electronic components, LEDs, semiconductor chips or power semiconductor chips are suitable as components. It is possible to dispense with a large number of process steps of conventional contacting methods.

Any organically or inorganically based circuit carriers come into consideration as substrates. Such substrates are, for example, PCB (Printed Circuit Board), DCB, IM (Insulated Metal), HTCC (High-Temperature Cofired Ceramics) and LTCC (Low-Temperature Cofired Ceramics) substrates.

The laminating is advantageously performed in a vacuum press. Vacuum forming, hydraulic vacuum pressing, vacuum gas-pressure pressing or similar laminating methods are conceivable for this. The pressure is advantageously applied isostatically. The laminating is performed for example at temperatures of from 100° C. to 250° C. and a pressure of from 1 bar to 10 bar. The precise laminating process parameters, that is to say the pressure, temperature, time, etc., are dependent, inter alia, on the topology of the substrate, the plastic material of the insulating film and the thickness of the insulating film.

For sheet contacting, physical or chemical depositing of the electrically conducting material is advantageously carried out. Physical methods of this type are sputtering and vapor depositing (Physical Vapor Deposition, PVD). Chemical depositing may be performed from the gas phase (Chemical Vapor Deposition, CVD) and/or the liquid phase (Liquid Phase Chemical Vapor Deposition). It is also conceivable first to use one of these methods to apply a thin electrically conducting partial layer, on which a thicker electrically conducting partial layer is then galvanically deposited.

In the method according to at least one embodiment of the invention, it is preferable and advantageous to use a substrate with a surface which is loaded with one or more semiconductor chips, in particular power semiconductor chips, in each of which there is or are one or more contact areas to be contacted, and the at least one insulating film is laminated on this surface under a vacuum, so that the insulating film closely covers the surface, including any semiconductor chip and any contact area, and adheres to this surface, including any semiconductor chip.

The insulating film is in this case formed for example in such a way that it is possible in particular to overcome a difference in height of up to about 5 mm. Among the causes of the difference in height are the topology of the substrate and the semiconductor chips arranged on the substrate. Similarly, SMD components (surface mounted devices) may be applied, for example soldered on.

The insulating film may consist of any desired thermoplastic or thermosetting materials and mixtures thereof. Preferably and advantageously used as the film in the method according to the invention is a film of a plastic material based on polyimide (PI), polyethylene (PE), polyphenol, polyetheretherketone (PEEK) and/or epoxy. The film may in this case have an adhesive coating to improve the adhesion on the surface.

According to an advantageous refinement of at least one embodiment, the metallization is applied prior to the lamination to a further laminated-on insulating film of electrically insulating plastic material on the surface side that is facing the contact area. This additional insulating film has no opening, but with preference has the metallization in the region of the opening.

According to an advantageous refinement of at least one embodiment, a substrate with a surface loaded with one or more power semiconductor chips is used.

According to an advantageous refinement of at least one embodiment, metallizations on different surface sides are electrically connected to one another. This may be performed by means of contact pins.

According to a further advantageous refinement of at least one embodiment, insulating films of a plastic material based on polyimide, polyethylene, polyphenol, polyetheretherketone and/or epoxy and, as one-sided or two-sided metallizations, copper, aluminum, iron and/or silver or comparable electrical conductors are used. A plastic film may consequently be coated with metal on one surface side or on both surface sides. In principle, pure metal layers can also be used.

According to a further advantageous refinement of at least one embodiment, a metallization of the insulating film is provided over its full surface area or part of its surface area or prestructured. The connecting structure corresponds to the required connection of electrical or electronic components that can be mounted on a substrate by conventional methods. The metal structure may be created for example by means of a photolithographic process. Conventional structuring methods can similarly be used.

The metallization of the insulating film may be structured by laser ablation, punching, etching or by a photolithographic process.

The sheet contacting of each bared contact area may be carried out by means of thermal pressing, soldering on and/or adhesive attachment of the metallized insulating film having the metallization.

Additional metallized connecting films, having at least one metallization, may be used for the sheet contacting. The connecting films may be fixed by soldering on or adhesive attachment.

According to a further advantageous refinement of at least one embodiment, the contacting of each bared contact area is carried out by means of soldering on and/or adhesive attachment of the metallized insulating film, i.e. the insulating film having the metallization. The contacting is performed in a sheet-like manner. The contacting may be performed from the metallized insulating film into the bared contact area. The converse case, leading the exposed contact area outward to the metal conductor tracks can similarly be carried out if the contact areas are appropriately provided.

According to a further advantageous refinement of at least one embodiment, the laminating of the series of insulating layers is repeated in such a way that a multilayer construction is created. Similarly, insulating layer thicknesses can be increased in this way.

According to a further advantageous refinement of at least one embodiment, a metallized insulating film with a thickness (d), for example in particular in the range from 25 to 250 µm, is used.

According to a further advantageous refinement of at least one embodiment, additional steps performed are application of an insulating covering on the side of the uppermost insulating film that is facing away from the substrate and application of a metal layer onto this insulating covering, to create a hermetic seal, and creation of direct contacting of the metal layer by way of a direct metal connection to an edge region of the substrate. The metal layer serves as mechanical protection, as a cover, with heat-dissipating properties. Between the metal layer and the metallized insulating film having a metallization, the insulating covering serves as electrical insulation.

According to a further advantageous refinement of at least one embodiment, heat sinks are attached to the hermetic seal from above and/or to the substrate from below. This allows improved heat dissipation to the surroundings.

The further advantageous refinements have associated devices that are created by way of the stated methods.

BRIEF DESCRIPTION OF THE DRAWINGS

Advantageous embodiments of the present invention are described in more detail with reference to the figures, in which:

FIG. 3 shows a representation of a third example embodiment of the device according to the invention, FIG. 4 shows a greatly simplified plan view of the third example embodiment of the device according to the invention.

DETAILED DESCRIPTION OF THE EXAMPLE EMBODIMENTS

Figure 1:
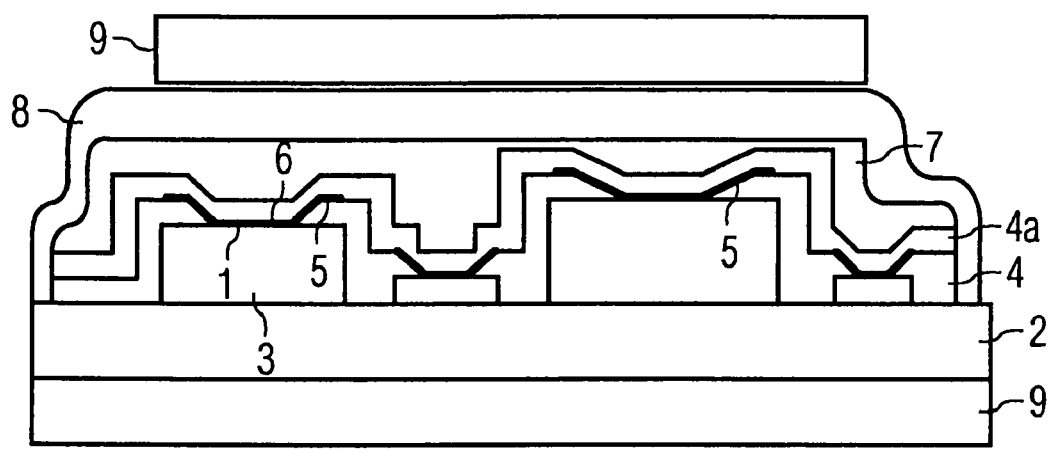
FIG. 1 shows a representation of a first example embodiment of a device according to the invention or of the method.

FIG. 1 shows the construction of a device according to an example embodiment, with at least one electrical contact area 1 on a surface of a substrate 2 and/or at least one component 3 arranged on the substrate. Laminated by a vacuum on the surfaces of the substrate 2 and of the component 3 is at least one electrically insulating film 4, which is in close contact with and adheres to the surface lying on it. At least one metallization 5 is applied to at least one surface side of the at least one insulating film 4. The insulating film 4 has at the contact area 1 at least one window 6, in which the contact area 1 is contacted in a sheet-like manner with the metallization 5. In addition, an insulating covering 7 is applied to the insulating film 4, and a metal layer 8 to the insulating covering 7, direct contacting of the metal layer being created by means of a direct metal connection to an edge region of the substrate to create a hermetic seal of the device. A heat sink 9 is respectively arranged above the hermetic seal and underneath the substrate.

Figure 2:
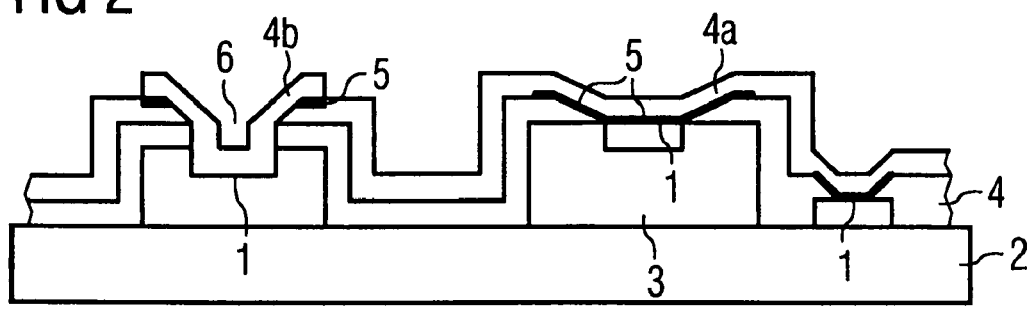
FIG. 2 shows a representation of a second example embodiment of the device according to the invention or of the method.

FIG. 2 shows an embodiment with respect to the contacting through windows 6 in the at least one insulating film 4. For example, the contacting of each bared contact area 1 is carried out by means of soldering on and/or adhesive attachment of the metallized insulating film 4a. Comparable connecting methods can likewise be used. The contacting is performed in a sheet-like manner. The contacting may be performed from the metallized insulating film 4a into the bared contact area. The converse case, leading metallized connecting films 4b (provided separately or as a continuation of the contact area 1) from the bared contact area 1 outward to the metal conductor tracks 5 can similarly be carried out if the contact areas 1 are appropriately provided.

FIG. 3 shows how a metallized insulating film 4a, self-supporting beyond the outer edges of the substrate 2 and structured, can be used for the connection to external terminals. Differences in height can similarly be leveled out in this way. This type of flexible contacting replaces or supplements additional plug connections or comparable connecting device. The thicknesses of the film and copper can be variably adapted to the respective mechanical, electrical, thermal and comparable requirements.

According to FIG. 3, the metallized insulating film 4a is created over an insulating film 4, beyond the substrate 2 on the left-hand side of the substrate 2, over a coating 10 with non-adhesive properties, for example a Teflon structure 10. The Teflon layer 10 may be removed or separated from the insulating films 4 and 4a in such a way that they are created as bared or projecting from the substrate 2.

FIG. 4 shows a greatly simplified view of FIG. 3 from above. The bared insulating films 4 and 4a can be clearly seen. They respectively project beyond the surface area of the substrate 2. A hermetic seal of the device can be additionally created by way of a metal layer 8 over an insulating covering 7.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

The invention claimed is:

1. A method for contacting at least one electrical contact area on a surface of at least one of a substrate and a component arranged on the substrate, the method comprising:
    laminating, under vacuum, at least one first insulating film onto the surface of the at least one of the substrate and the component that includes the contact area, wherein the first insulating film includes an electrically insulating plastic material;
    baring the contact area to be contacted on the surface by opening a window in the first insulating film;
    sheet contacting the bared contact area with at least one first metallization on the first insulating film, and
    laminating a second insulating film onto the surface of the at least one of the substrate and the component, wherein a second metallization is applied to the second insulating film prior to laminating the second insulating film.

2. The method as claimed in claim 1, wherein the first metallization is applied to at least one surface side of the at least one first insulating film before or after the lamination.

3. The method as claimed in claim 1, wherein first metallizations are applied on different surface sides of the first insulating film, the first metallizations being electrically connected to one another.

4. The method as claimed in claim 1, wherein the electrically insulating plastic material is based on at least one of polyimide, polyethylene, polyphenol, polyetheretherketone and epoxy and,
    at least one of copper, aluminum, iron and silver are used as one-sided or two-side first metallizations.

5. The method as claimed in claim 1, wherein the first metallization is provided over a portion or an entire surface area of the first insulating film.

6. The method as claimed in claim 1, wherein the first metallization of the first insulating film is structured by at least one of lasering, punching, and by a wet-chemical method.

7. The method as claimed in claim 1, wherein the sheet contacting of each bared contact area is carried out by way of at least one of thermoforming or thermal pressing, soldering on, welding and adhesive attachment of the first insulating film having the first metallization.

8. The method as claimed in claim 1, wherein additional metallized connecting films, having at least one of the first metallizations, are used for the sheet contacting.

9. The method as claimed in claim 1, wherein the first insulating film having the first metallization is created such that the first insulating film is self-supporting beyond the outer edges of the substrate and structured for the connection to external terminals.

10. The method as claimed in claim 1, further comprising:
    applying an insulating covering to an uppermost insulating film; and
    applying a metal layer to the insulating covering and direct contacting the metal layer by way of a direct metal connection to an edge region of the substrate to create a hermetic seal.

11. The method as claimed in claim 1, further comprising:
    applying at least one heat sink at least one of above the hermetic seal and underneath the substrate.

12. A device, comprising:
    at least one electrical contact area on a surface of at least one of a substrate and a component arranged on the substrate,
    wherein a first electrically insulating film and a second electrically insulating film are laminated, under vacuum, on the surface of the at least one of the substrate and the component,
    at least one first metallization is applied to at least one surface side of the first insulating film,
    the first insulating film has from the contact area to the first metallization a window, in which the contact area is contacted in a sheet-like manner with the first metallization, and
    a second metallization is applied to at least one surface side of the second insulating film prior to laminating the second insulating film on the at least one of the substrate and the component.

13. The device as claimed in claim 12, wherein the first insulating film having the first metallization is formed such that the first insulating film is self-supporting beyond the outer edges of the substrate and structured for the connection to external terminals.

14. The device as claimed in claim 12, further comprising:
    an insulating covering applied to an uppermost insulating film; and
    a metal layer applied to the insulating covering, direct contacting of the metal layer being created by way of a direct metal connection to an edge region of the substrate to create a hermetic seal of the device.

15. The device as claimed in claim 14, wherein at least one heat sink is arranged at least one of above the hermetic seal and underneath the substrate.

16. The method as claimed in claim 1, wherein the first metallization of the first insulating film is prestructured in the form of conductor tracks.

17. The device as claimed in claim 13, further comprising:
    an insulating covering applied to an uppermost insulating film; and
    a metal layer applied to the insulating covering, direct contacting of the metal layer being created by way of a direct metal connection to an edge region of the substrate to create a hermetic seal of the device.

18. The device as claimed in claim 17, wherein at least one heat sink is arranged at least one of above the hermetic seal and underneath the substrate.

19. The method as claimed in claim 1, wherein the second metallization is applied to a surface of the second insulating film facing the at least one electrical contact area.

* * * * *